(12) United States Patent
Sun

(10) Patent No.: US 11,070,178 B1
(45) Date of Patent: Jul. 20, 2021

(54) CLASS D POWER AMPLIFIER

(71) Applicant: ELITE SEMICONDUCTOR MEMORY TECHNOLOGY INC., Hsinchu (TW)

(72) Inventor: Shao-Ming Sun, Hsinchu (TW)

(73) Assignee: ELITE SEMICONDUCTOR MEMORY TECHNOLOGY INC., Hsinchu (TW)

(*) Notice: Subject to any disclaimer, the term of this patent is extended or adjusted under 35 U.S.C. 154(b) by 0 days.

(21) Appl. No.: 16/849,428

(22) Filed: Apr. 15, 2020

(51) Int. Cl.
*H03F 3/217* (2006.01)
*H03F 3/24* (2006.01)

(52) U.S. Cl.
CPC ............. *H03F 3/217* (2013.01); *H03F 3/245* (2013.01); *H03F 2200/03* (2013.01); *H03F 2200/171* (2013.01); *H03F 2200/351* (2013.01); *H03F 2200/504* (2013.01); *H03F 2200/78* (2013.01)

(58) Field of Classification Search
CPC .................................. H03F 3/217; H03F 3/38
USPC ........................................ 330/10, 207 A, 251
See application file for complete search history.

(56) References Cited

U.S. PATENT DOCUMENTS

| | | | | |
|---|---|---|---|---|
| 7,109,789 B2* | 9/2006 | Spencer | ................ | H03F 3/2171 330/10 |
| 7,425,864 B2* | 9/2008 | Risbo | ...................... | H03F 3/217 330/10 |
| 7,609,110 B2* | 10/2009 | Wang | .................... | H03F 1/0205 330/10 |

* cited by examiner

*Primary Examiner* — Henry Choe
(74) *Attorney, Agent, or Firm* — Juan Carlos A. Marquez; Marquez IP Law Office, PLLC

(57) ABSTRACT

A class D power amplifier with novel design is provided. The amplifier includes an input stage, a periodic signal generator, a comparator, a power output stage, and a boost circuit. The input stage is coupled to a first supply voltage. The periodic signal generator generates a periodic signal and a reference signal. The power output stage is coupled to a second supply voltage. The boost circuit compares an output of the input stage with the reference signal, and thereby adjusts a value of the second supply voltage. The value of the second supply voltage is larger than a value of the first supply voltage. The reference signal is proportional to an amplitude of the periodic signal, and the amplitude of the periodic signal is determined by the value of the second supply voltage.

6 Claims, 4 Drawing Sheets

CLASS D POWER AMPLIFIER

BACKGROUND OF THE INVENTION

1. Field of the Invention

The present invention generally relates to a class D power amplifier.

2. Description of the Related Art

FIG. 1 shows a conventional block diagram of a class D power amplifier 100. Referring to FIG. 1, the class D power amplifier comprises an input stage 10, a comparator 12, and a power output stage 14. The input stage 10 comprises an operational amplifier (not shown) coupled to a low power supply voltage VDD. The comparator 12 compares an output voltage Vs of the input stage 10 with a periodic signal to generate a comparison result cmp. The power output stage 14 is coupled to a high power supply voltage PVDD, wherein the supply voltage PVDD is generated by a boost circuit 16. The voltage level of the supply voltage PVDD is larger than that of the supply voltage VDD.

In order to maintain high efficiency, the conventional class D power amplifier 100 uses a voltage detection circuit 18 to detect the amplitude of an input voltage IN. Therefore, the voltage level of the supply voltage PVDD is adjusted according to the amplitude of the input signal IN. However, in the case where the amplitude of the input signal IN is small, the efficiency of the conventional class D power amplifier 100 is poor.

SUMMARY OF THE INVENTION

One aspect of the present invention is a class D power amplifier.

According to one embodiment of the present invention, the class D power amplifier comprises an input stage, a comparison unit, a power output stage, a boost circuit, and a periodic signal generator. The input stage is configured to receive a first power supply voltage. The periodic signal generator is configured to generate a periodic signal and a reference signal. The comparison unit is configured to compare an output voltage of the input stage with the periodic signal to generate a first comparison result. The power output stage is configured to receive a second power supply voltage and receive the first comparison result to generate a pulse width modulation signal. The boost circuit is configured to compare the output voltage of the input stage with the reference signal to adjust the voltage level of the second power supply voltage. The voltage level of the second power supply voltage is larger than that of the first power supply voltage. The reference signal is proportional to the amplitude of the periodic signal, and the amplitude of the periodic signal is determined by the voltage level of the second power supply voltage.

BRIEF DESCRIPTION OF THE DRAWINGS

The invention will be described according to the appended drawings in which.

DETAILED DESCRIPTION OF THE INVENTION

Figure 1:
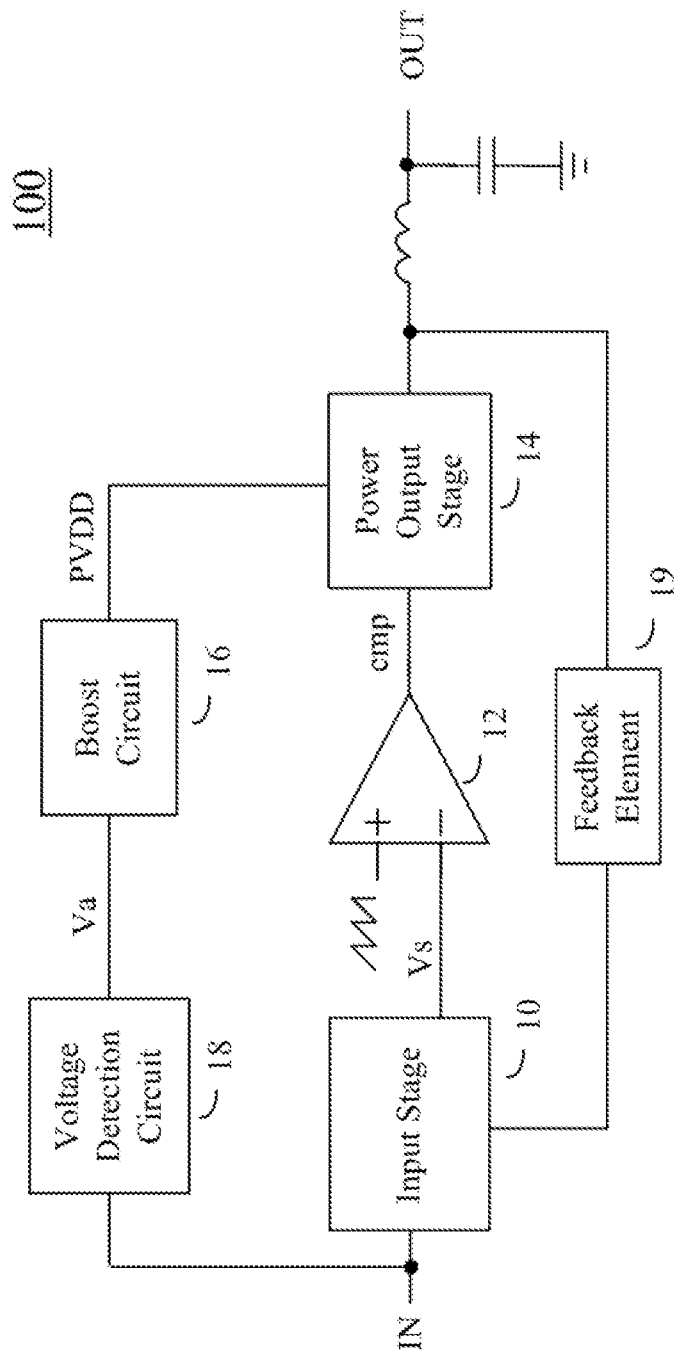
FIG. 1 shows a conventional block diagram of a class D power amplifier.
Figure 2:
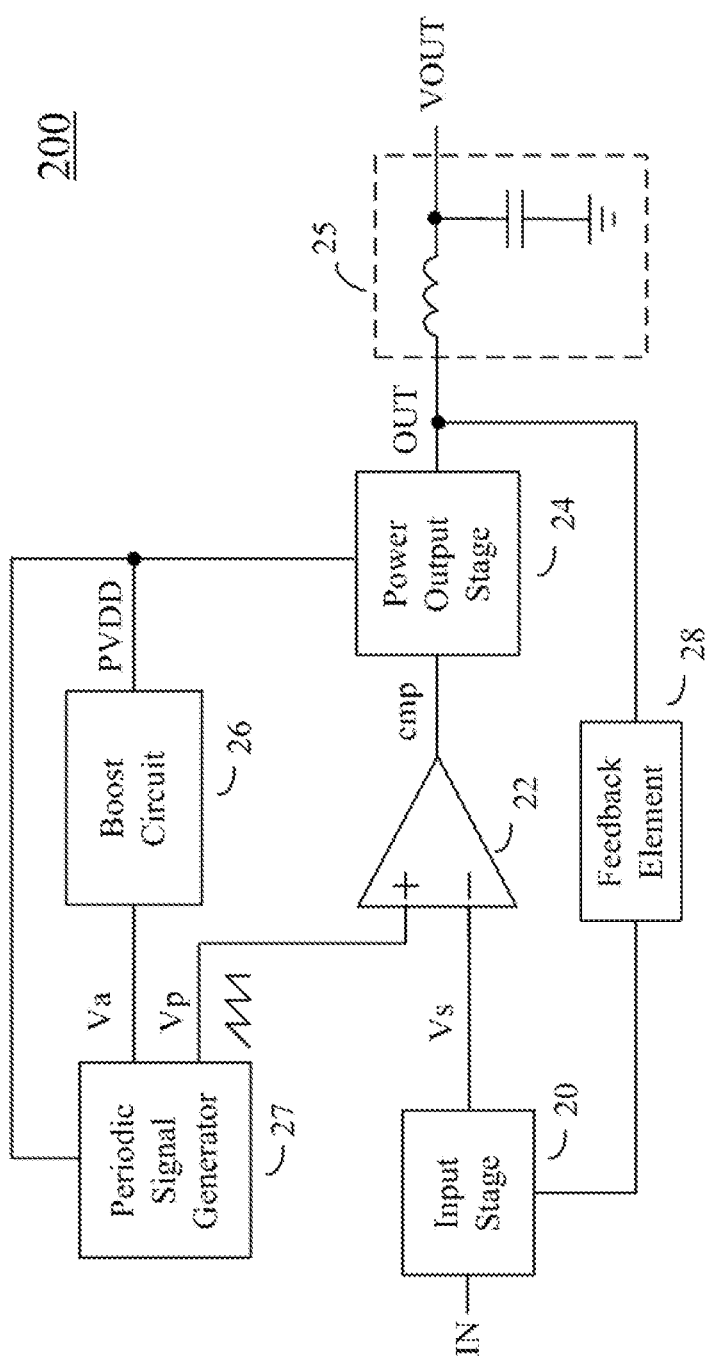
FIG. 2 shows a block diagram of a class D power amplifier according to one embodiment of the present invention.

FIG. 2 shows a block diagram of a class D power amplifier 200 according to one embodiment of the present invention. Referring to FIG. 2, the class D power amplifier comprises an input stage 20, a comparison unit 22, a power output stage 24, a low-pass filter 25, a boost circuit 26, and a periodic signal generator 27. The input stage 20 is configured to receive a power supply voltage VDD. The periodic signal generator 27 is configured to generate a periodic signal Vp, e.g. a periodic sawtooth signal or a periodic ramp signal. The comparison unit 22 is configured to compare an output voltage Vs of the input stage 20 with the periodic signal Vp to generate a comparison result cmp. The power output stage 24 is configured to receive the comparison result cmp to generate a pulse width modulation signal OUT. The low-pass filter 25 is configured to attenuate the high frequency portion of the signal OUT to generate a smooth analog output signal VOUT. The output signal VOUT is then sent to a speaker (not shown).

Referring to FIG. 2, the power output stage 24 is configured to receive another power supply voltage PVDD, wherein the power supply voltage PVDD is generated by the boost circuit 26. The voltage level of the power supply voltage PVDD is larger than that of the power supply voltage VDD. The power supply voltage PVDD is also sent to the periodic signal generator 27 so as to adjust the amplitude of the periodic signal Vp.

Figure 3:
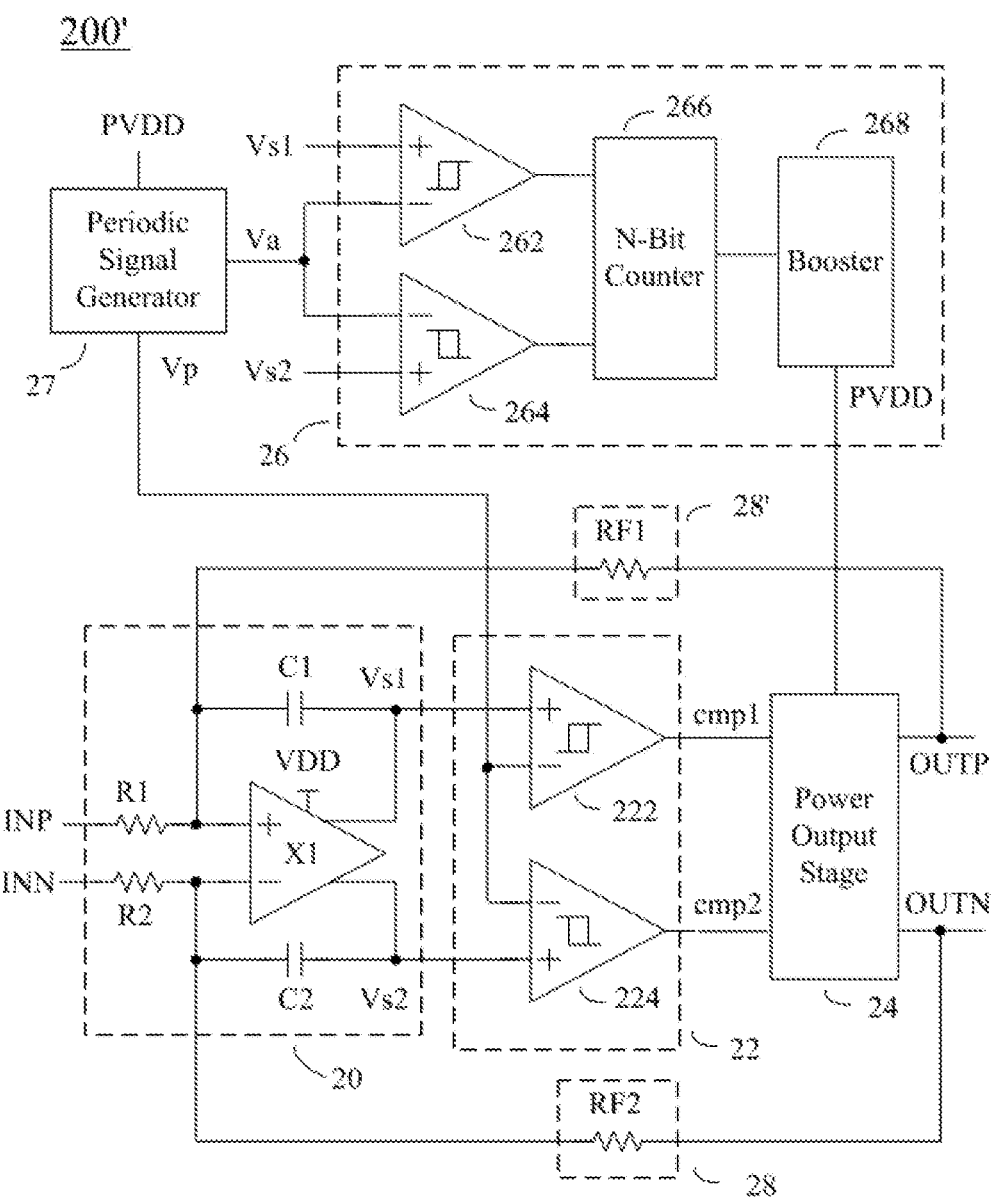
FIG. 3 shows parts of the circuits of the class D power amplifier according to one embodiment of the present invention.

FIG. 3 shows parts of the circuits of the class D power amplifier 200' according to one embodiment of the present invention. Referring to FIG. 3, the input stage 20 comprises a differential-input differential-output amplifier X1, resistors R1 and R2, and capacitors C1 and C2. The resistors R1 and R2 receive first and second input signals INP and INN, respectively. In this embodiment, the inputs signals INP and INN are a pair of audio differential signals. The differential-input differential-output amplifier X1 is shown as an example. However, the present invention is not limited to this configuration and many alternative configurations can be used, such as the amplifier X1 can be a single input amplifier architecture.

Referring to FIG. 3, the comparison unit 22 comprises comparators 222 and 224. The comparator 222 compares an output voltage Vs1 of the amplifier X1 with the periodic signal Vp to generate a comparison result cmp1. The comparator 224 compares an output voltage Vs2 of the amplifier X1 with the periodic signal Vp to generate a comparison result cmp2. In one embodiment, the comparison results cmp1 and cmp2 are complementary signals. The power output stage 24 receives the comparison results cmp1 and cmp2 to generate a pair of complementary pulse width modulation signals OUTP and OUTN. In this embodiment, feedback elements 28 and 28' are resistors RF1 and RF2. The feedback elements 28 and 28' are coupled between the input stage 20 and the power output stage 24. The feedback elements 28 and 28' transmit the signals OUTP and OUTN to the inputs of the amplifier X1, respectively.

Referring to FIG. 3, the boost circuit 26 comprises comparators 262 and 264. The comparator 262 compares the output voltage Vs1 of the amplifier X1 with a signal Va, and the comparator 264 compares the output voltage Vs2 of the amplifier X1 with the signal Va. The signal Va is sent from the periodic signal generator 27, and is proportional to the amplitude of the periodic signal Vp.

Figure 4:
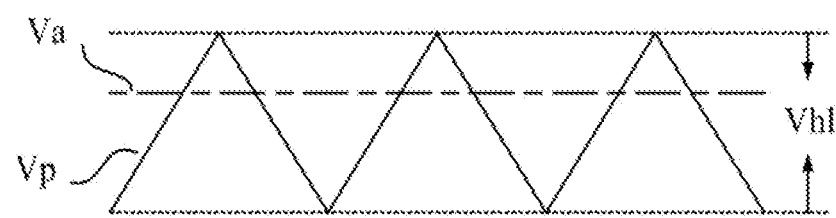
FIG. 4 is a diagram illustrating the relationship between the periodic signal Vp and the signal Va illustrated in FIG. 3.

FIG. 4 is a diagram illustrating the relationship between the periodic signal Vp and the signal Va illustrated in FIG. 3. In this embodiment, the periodic signal Vp is a periodic sawtooth signal with the amplitude vh1, wherein the amplitude vh1 is determined by the voltage level of the power supply voltage PVDD. The voltage Va is a direct-current (DC) voltage with the value that equals to α×vh1, wherein a is between 0 and 1.

Referring to FIG. 3, the boost circuit 26 further comprises an n-bit counter 266 and a booster 268. In one embodiment, a low-pass filter (not shown) is interposed between the outputs of the amplifier X1 and the inputs of the comparators 262 and 264 to remove noise from the outputs of the amplifier X1. The n-bit counter 266 receives comparison results of the comparators 262 and 264 to generate n-bit output. The booster 268 receives the n-bit output to adjust the voltage level of the power supply voltage PVDD. The booster 268 can be a switching DC-to-DC converter or a charge pump. The power supply voltage PVDD is then sent to the power output stage 24 to generate the complementary pulse width modulation signals OUTP and OUTN.

In one embodiment, the n-bit counter 266 outputs codes [0 0] when the output voltages Vs1, Vs2 are smaller than the signal Va. In this case, the booster 268 provides the power supply voltage PVDD with a first voltage level. With the increasing difference between the input signal INN and INP, the output voltages Vs1 and Vs2 of the amplifier X1 increases. When the output voltages Vs1, Vs2 are larger than the signal Va, the n-bit counter 266 outputs codes [0 1]. Therefore, the booster 268 provides the power supply voltage PVDD with a second voltage level, wherein the second voltage level is larger than the first voltage level. Since the amplitude of the periodic signal Vp is determined by the voltage level of the power supply voltage PVDD, when the output voltages Vs1, Vs2 increase to a value larger than the signal Va, the voltage level of the power supply voltage PVDD increases, raising the amplitude of the periodic signal Vp. In other words, the amplitude of the periodic signal Vp is adjusted according to the output signals of the amplifier X1.

The above-described embodiments of the present invention are intended to be illustrative only. Numerous alternative embodiments may be devised by those skilled in the art without departing from the spirit and scope of the invention as recited in the following claims.

What is claimed is:

1. A class D power amplifier, comprising:
    an input stage configured to receive a first power supply voltage;
    a periodic signal generator configured to generate a periodic signal and a reference signal;
    a comparison unit configured to compare an output voltage of the input stage with the periodic signal to generate a first comparison result;
    a power output stage configured to receive a second power supply voltage and receive the first comparison result to generate a pulse width modulation signal; and
    a boost circuit configured to compare the output voltage of the input stage with the reference signal to adjust the voltage level of the second power supply voltage;
    wherein the voltage level of the second power supply voltage is larger than that of the first power supply voltage; and
    wherein the reference signal is proportional to the amplitude of the periodic signal, and the amplitude of the periodic signal is determined by the voltage level of the second power supply voltage.

2. The class D power amplifier of claim 1, further comprising a feedback element coupled between the input stage and the power output stage.

3. The class D power amplifier of claim 2, further comprising a low-pass filter configured to attenuate the high frequency portion of the pulse width modulation signal.

4. The class D power amplifier of claim 1, wherein the input stage comprises a differential-input differential-output amplifier, and the amplifier receives a pair of audio differential signals.

5. The class D power amplifier of claim 1, wherein the boost circuit comprises:
    a comparator configured to compare the output voltage of the input stage with the reference signal to generate a second comparison result;
    a n-bit counter configured to receive the second comparison result to generate n-bit output; and
    a booster configured to receive the n-bit output to adjust the voltage level of the second power supply voltage.

6. The class D power amplifier of claim 5, wherein the booster is a switching DC-to-DC converter or a charge pump.

* * * * *